(12) United States Patent
Kumar et al.

(10) Patent No.: US 10,830,806 B2
(45) Date of Patent: Nov. 10, 2020

(54) AIRPLANE POWER MONITORING SYSTEM

(71) Applicant: The Boeing Company, Chicago, IL (US)

(72) Inventors: Anil Kumar, Sammamish, WA (US); Kamiar J. Karimi, Kirkland, WA (US); Timothy M. Mitchell, Seattle, WA (US); Evelyn M. Matheson, Bothell, WA (US); Eugene V. Solodovnik, Kenmore, WA (US)

(73) Assignee: The Boeing Company, Chicago, IL (US)

( * ) Notice: Subject to any disclaimer, the term of this patent is extended or adjusted under 35 U.S.C. 154(b) by 406 days.

(21) Appl. No.: 15/785,752

(22) Filed: Oct. 17, 2017

(65) Prior Publication Data

US 2019/0113558 A1    Apr. 18, 2019

(51) Int. Cl.
*G01R 31/00* (2006.01)
*G01R 31/40* (2020.01)

(52) U.S. Cl.
CPC ........... *G01R 31/008* (2013.01); *G01R 31/40* (2013.01); *B64D 2221/00* (2013.01)

(58) Field of Classification Search
CPC .... G01R 31/008; G01R 31/40; G01R 31/086; B64D 2221/00; B64D 45/0015; B64D 45/0059; G01L 5/0052; G01L 1/00
USPC ........ 324/76.11, 750.01, 503, 509, 426, 437, 324/96, 97, 74, 762.01–762.1
See application file for complete search history.

(56) References Cited

U.S. PATENT DOCUMENTS

2005/0057869 A1* 3/2005 Hale ................. H02H 5/10
361/64
2015/0005990 A1* 1/2015 Burns ................. G05D 23/00
701/3

OTHER PUBLICATIONS

Abdel-Hafez, "Power Generation and Distribution System for a More Electric Aircraft—A Review," Recent Advances in Aircraft Technology, Dr. Ramesh Agarwal (Ed.), InTech, 2012, 21 pages. http://cdn.intechopen.com/pdfs/28814/InTech-Power_generation_and_distribution_system_for_a_more_electric_aircraft_a_review.pdf.
Karimi, "Future Aircraft Power Systems—Integration Challenges," The Boeing Company, copyright 2007, 27 pages. http://eng.umd.edu/~austin/ense622.d/lecture-resources/Boeing787-MoreElectricAircraft.pdf.

* cited by examiner

*Primary Examiner* — Vincent Q Nguyen
*Assistant Examiner* — Trung Nguyen
(74) *Attorney, Agent, or Firm* — Yee & Associates, P.C.

(57) ABSTRACT

A method for managing power in an airplane. Power quality data and load management data are collected from airplane systems in the airplane at a variable sampling rate using data collectors assigned to the airplane systems in which the variable sampling rate increases in response to a selected trigger event. The power quality data and the load management data are received by a power monitor from the data collectors during phases of flight for the airplane. A group of load management operations for the airplane systems are performed by a load manager in the airplane during operation of the airplane. The group of load management operations is performed using the power quality data and the load management data received from the data collectors during the phases of flight for the airplane.

20 Claims, 8 Drawing Sheets

AIRPLANE POWER MONITORING SYSTEM

BACKGROUND INFORMATION

1. Field

The present disclosure relates generally to airplanes and, in particular, to managing power in an airplane.

2. Background

Airplanes such as commercial airliners increasingly have more and more airplane systems that utilize electric power. For example, systems such as an environmental control system (ECS), a communications system, electric anti-icing systems, electric engine start, and an in-flight entertainment system utilize electrical power. These types of systems are examples of electrical loads in an airplane.

Currently, loads are prone to undesired performance when exposed to one or more quality problems with electrical power. The power input into these loads may have variations in voltage, current, or frequency that may fall out of the specifications for desired power by the loads. Further, interactions between different loads and sources may affect stability and resonance. As the number of airplane systems that utilize electric power increases, challenges, with respect to managing the power system, increases.

Therefore, it would be desirable to have a method and apparatus that take into account at least some of the issues discussed above, as well as other possible issues. For example, it would be desirable to have a method and apparatus that overcome a technical challenge with managing power in an airplane.

SUMMARY

An embodiment of the present disclosure provides an airplane power monitoring system. The airplane monitoring system is comprised of a computer system in an airplane, data collectors assigned to airplane system that use power in the airplane, and a power monitor in the computer system. The data collectors collect power quality data and load management data from the airplane systems at a variable sampling rate that increases in response to a selected trigger event. The power monitor is configured to receive the power quality data and the load management data from the data collectors during phases of flight for the airplane.

Another embodiment of the present disclosure provides a method for managing power in an airplane. Power quality data and load management data are collected from airplane systems in the airplane at a variable sampling rate using data collectors assigned to the airplane systems in which the variable sampling rate increases in response to a selected trigger event. The power quality data and the load management data are received by a power monitor from the data collectors during phases of flight for the airplane. A group of load management operations for the airplane systems are performed by a load manager in the airplane during operation of the airplane. The group of load management operations is performed using the power quality data and the load management data received from the data collectors during the phases of flight for the airplane.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

The illustrative embodiments recognize and take into account one or more different considerations. The illustrative embodiments recognize and take into account that obtaining power quality and load management information about airplane systems that use electric power can be useful in understanding overall power quality in airplanes and in predicting degradation in the different airplane systems. The illustrative embodiments recognize and take into account that, currently, an integrated power quality and load management system is unavailable for use in managing electric power in an airplane. In this disclosure, "electric power" is also referred to just as "power."

Thus, the illustrative embodiments provide a method, apparatus, and system for an integrated power quality and load management function that enables collecting data about power quality and load management in an airplane. In one illustrative example, this integrated system can take the form of an airplane power monitoring system. This power monitoring system includes a computer system, data collectors, and a power monitor. The data collectors are assigned to airplane systems that use power in the airplane. The data collectors collect power quality data and load management data from the airplane systems at a variable sampling rate that increases in response to a selected trigger event. The power monitor is in the computer system, which is located in the airplane. The power monitor is configured to receive the power quality data and the load management data from the data collectors during phases of flight for the airplane. This aggregating of the power quality data and the load management data from the airplane systems by the power monitor enables performing a group of load management operations for the airplane systems during operation of the airplane.

Figure 1:
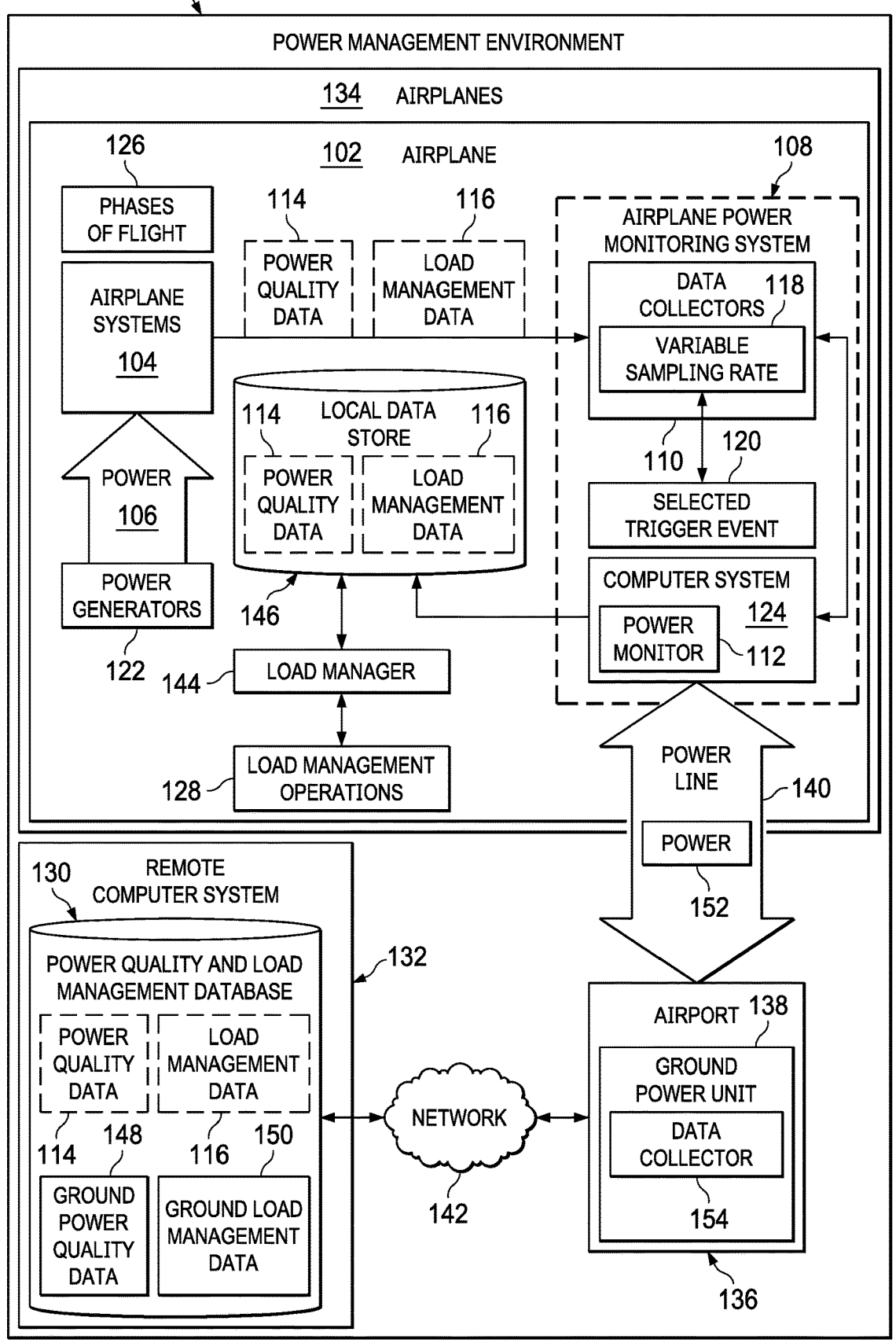
FIG. 1 is an illustration of a block diagram of a power management environment in accordance with an illustrative embodiment.

With reference now to the figures and, in particular, with reference to FIG. 1, an illustration of a block diagram of a power management environment is depicted in accordance with an illustrative embodiment. In this illustrative example, power management environment 100 includes airplane 102. In this illustrative example, airplane 102 is a powered flying vehicle with fixed wings and a weight greater than the air that it displaces. In this illustrative example, airplane 102 is a commercial airplane.

Airplane 102 contains airplane systems 104 that use power 106. Airplane systems 104 include at least one of an environmental control system (ECS), an air flight control system, a navigation system, a radar system, a communication system, electric anti-icing systems, electrically driven hydraulics, a data network, a passenger electrical outlet system, an in-flight entertainment system, or other types of systems that utilize power 106. These types of systems are examples of loads in an airplane.

As used herein, the phrase "at least one of," when used with a list of items, means different combinations of one or more of the listed items may be used, and only one of each item in the list may be needed. In other words, "at least one of" means any combination of items and number of items may be used from the list, but not all of the items in the list are required. The item may be a particular object, a thing, or a category.

For example, without limitation, "at least one of item A, item B, or item C" may include item A, item A and item B, or item B. This example also may include item A, item B, and item C or item B and item C. Of course, any combinations of these items may be present. In some illustrative examples, "at least one of" may be, for example, without limitation, two of item A; one of item B; and ten of item C; four of item B and seven of item C; or other suitable combinations.

In this illustrative example, airplane power monitoring system 108 comprises a number of different components. As depicted, airplane power monitoring system 108 includes data collectors 110 and power monitor 112 located in airplane 102.

Data collectors 110 are assigned to airplane systems 104 that use power 106 in airplane 102. As depicted, data collectors 110 collect power quality data 114 and load management data 116 from airplane systems 104 at variable sampling rate 118 that increases in response to selected trigger event 120. At least one of data collectors 110 or power monitor 112 changes variable sampling rate 118. In the illustrative example, variable sampling rate 118 returns to a default sampling rate after at least one of a period of time, another trigger event, or some other suitable condition.

In the illustrative example, variable sampling rate can be set using a number of different considerations. For example, the sampling rate can be increased to increase the accuracy in assessing frequency domain types of characteristics. These characteristics include, for example, a harmonic spectrum, including alternating current components of a direct current bus. Increasing the sampling rate also may be used to determine when thresholds have been exceeded that would indicate out of tolerance performance in an airplane system. The increase in sampling rate also may be used to identify transient events, such as voltage spikes; high rate of change in voltage, current, and frequency; and a loss or interrupt of power.

Data rates may be decreased to assess average or steady-state conditions and to use the data to compare load profiles to documented load analyses. The sampling rate may be changed to balance the storage capacity and the fidelity of measurements. For example, 102400 bits/sec is present at 400 Hz cycle, 32 samples, and 8-bits per sample. For voltage waveforms on all the 3-phases and over 5-minute period this is about 92 Mbps. Two sources (L & R) and the current waveform results in large data storage requirements. This amount of data may be required in certain instances when an anomaly is observed. At other times, the sampling rate may be 5 samples per second.

As depicted, data collectors 110 can be configured to perform preprocessing of at least one of power quality data 114 or load management data 116. This preprocessing may include signal processing of voltages, currents, frequencies, or other parameters for electrical signals. This preprocessing may include identifying harmonics, modulation, power factors, or other suitable types of parameters. Data collectors 110 can store at least one of power quality data 114 or load management data 116 in raw form for preprocessed form. Data collectors 110 can send this data to power monitor 112 in response to an event. This event may be, for example, the expression of a timer, a request from power monitor 112, or some other suitable event.

As depicted, selected trigger event 120 may take a number of different forms. In this illustrative example, selected trigger event 120 is selected from a group comprising a phase of flight, a maneuver, an abnormal condition in a line replaceable unit, a current demand exceeding a threshold, airplane events, a voltage magnitude exceeding a threshold, a ripple voltage magnitude exceeding the threshold, a total harmonic distortion exceeding the threshold, a power interrupt, a power transfer, a selected pilot action, power monitor 112 requesting at least one of power quality data 114 or load management data 116 from data collectors 110, or some other suitable event. Selected trigger event 120 also may include correlated information of at least one of existing maintenance messages, faults, or status messages.

In the illustrative example, data collectors 110 are selected from at least one of a software application or a hardware unit. As depicted, a data collector may be implemented using software when an airplane system such as a line replaceable unit (LRU) has sufficient processing power and other resources to support the functionality of a data collector. In other illustrative examples, the data collector may be implemented in hardware such as a card that can be inserted into a line replaceable unit or a standalone device that can be connected to the line replaceable unit.

In this illustrative example, power quality data 114 comprises information about the quality of power 106 supplied to airplane systems 104 by a group of power generators 122. Power quality data 114 includes at least one of a voltage, a current, a frequency, a power, a reactive power, a power factor, a voltage harmonics, a current harmonics, a total harmonic distortion, an amplitude voltage modulation, a frequency voltage modulation, a current demand amplitude, a current demand frequency modulation, a voltage ripple amplitude, a current ripple amplitude, a current ripple frequency, a voltage ripple frequency, a power interrupt, or some other suitable parameter that indicates or can be used to identify the quality of power 106.

As used herein, "a group of," when used with reference to items, means one or more items. For example, "a group of power generators 122" is one or more of power generators 122. In this illustrative example, the group of power generators 122 may include at least one of an auxiliary power unit (APU), an electric generator, or some other suitable type of device that can supply power 106 within airplane 102.

As depicted, load management data 116 is data about the use of power 106 in airplane 102. Load management data 116 includes at least one of a load identifier, current demand harmonics, a current demand amplitude, a current frequency modulation, a ripple current amplitude, a ripple current frequency, a load impedance information, a load power factor, source impedance, impedance matching optimization, or some other suitable parameter that can be used to identify information about loads such as airplane systems 104. This data can be used to manage at least one of airplane systems 104 or power generators 122.

Variable sampling rate 118 is a rate at which data is collected by data collectors 110. Variable sampling rate 118 can change in response to events. These events are also referred to as trigger events. In this example, selected trigger event 120 is selected from a group comprising a phase of flight, a maneuver, an abnormal condition in a line replaceable unit, a current demand exceeding a threshold, airplane events, a voltage magnitude exceeding a threshold, a ripple voltage magnitude exceeding the threshold, a total harmonic distortion exceeding the threshold, a power interrupt, a power transfer, a selected pilot action, and some other suitable event or action that may affect at least one of power quality or load management.

In this illustrative example, power monitor 112 is located in computer system 124 in airplane 102. Computer system 124 is a physical hardware system and includes one or more data processing systems. When more than one data processing system is present, those data processing systems are in communication with each other using a communications medium. The communications medium may be a network. The data processing systems may be selected from at least one of a computer, a server computer, a tablet, or some other suitable data processing system.

As depicted, power monitor 112 is configured to receive power quality data 114 and load management data 116 from data collectors 110 during phases of flight 126 for airplane 102. This data can be received in a number of different ways. For example, the data can be received by a push by data collectors 110, a pull by power monitor 112, of some combination thereof.

Aggregating power quality data 114 and load management data 116 from data collectors 110 by power monitor 112 enables performing a group of load management operations 128 by load manager 144 during operation of airplane 102. The group of load management operations 128 also may be performed for at least one of power generators 122 or airplane systems 104. These load management operations may include at least one of changing a voltage, changing a current, changing a frequency, reducing power 106 to an airplane system, increasing power 106 to an airplane system, changing power generators 122, changing the path through which power 106 is delivered to a load, generating a log entry, generating a request for maintenance, or some other suitable type of operation.

As depicted, airplane power monitoring system 108 also includes power quality and load management database 130 located in remote computer system 132. Remote computer system 132 is a computer system in another location such as an airport, a maintenance facility, an airline, an airplane manufacturer, or some other suitable location.

In this illustrative example, power quality and load management database 130 is a data store and is configured to store power quality data 114 and load management data 116 for a group of airplanes 134, including airplane 102. For example, power monitor 112 in airplane 102 sends power quality data 114 and load management data 116 for airplane 102 to power quality and load management database 130.

As depicted, power quality data 114 and load management data 116 can be sent to power quality and load management database 130 when airplane 102 is on the ground at airport 136. In this example, ground power unit 138 at airport 136 is connected to airplane 102 by power line 140. In addition to supplying power 106 using power line 140, power monitor 112 can send power quality data 114 and load management data 116 to power quality and load management database 130 located remotely to airplane 102 over power line 140 using broadband over power line communications. In other illustrative examples, other types of communications links may be used in place or in addition to power line 140. For example, a wire link, an optical link, a wireless link, or some other suitable type of connection may be used.

In this example, ground power unit 138 is in communication with power quality and load management database 130 using network 142. Ground power unit 138 may take a number of different forms. For example, a ground target date may be selected from a group comprising a gate box in a fixed location at a date at airport 136, a power card, or in some other suitable form. Ground power unit 138 is configured to provide electrical power to airplane 102 at airport 136. This power may be used to operate lights, a galley, or some other system within airplane 102.

In this illustrative example, network 142 may take a number of different forms. For example, network 142 can be selected from at least one of a local area network, a wide area network, an intranet, the Internet, or some other suitable type of network.

At least one of power monitor 112 or data collectors 110 can be implemented in software, hardware, firmware, or a combination thereof. When software is used, the operations performed by at least one of power monitor 112 or data collectors 110 may be implemented in program code configured to run on hardware, such as a processor unit. When firmware is used, the operations performed by at least one of power monitor 112 or data collectors 110 may be implemented in program code and data and stored in persistent memory to run on a processor unit. When hardware is employed, the hardware may include circuits that operate to perform the operations in at least one of power monitor 112 or data collectors 110.

In the illustrative examples, the hardware may take a form selected from at least one of a circuit system, an integrated circuit, an application specific integrated circuit (ASIC), a programmable logic device, or some other suitable type of hardware configured to perform a number of operations. With a programmable logic device, the device may be configured to perform the number of operations. The device may be reconfigured at a later time or may be permanently configured to perform the number of operations. Programmable logic devices include, for example, a programmable logic array, a programmable array logic, a field programmable logic array, a field programmable gate array, and other suitable hardware devices. Additionally, the processes may be implemented in organic components integrated with inorganic components and may be comprised entirely of organic components excluding a human being. For example, the processes may be implemented as circuits in organic semiconductors.

Further, power quality data 114 and load management data 116 can be stored locally in local data store 146 in airplane 102 in addition to being sent to power quality and load management database 130. Load manager 144 in airplane 102 can use power quality data 114 and load management data 116 stored locally in local data store 146 to manage at least one of loads such as airplane systems 104 or power generators 122 in airplane 102. Local data store 146 may be a computer, a hard drive, memory, a solid-state drive, or some other suitable device for storing information. With this locally-stored information, load manager 144 can perform load management operations 128 for at least one of airplane systems 104 or power generators 122.

In yet another illustrative example, ground power unit 138 may be assigned data collector 154. As depicted, data collector 154 is configured to collect at least one of ground power quality data 148 or ground load management data 150. As depicted, power monitor 112 receives at least one of ground power quality data 148 or ground load management data 150 for ground power unit 138 from data collector 154 assigned to ground power unit 138.

This data can provide insight on how power 152, provided by ground power unit 138, can affect maintenance for airplane systems 104. Power 152 is electrical power. As depicted, at least one of ground power quality data 148 or ground load management data 150 can be received by at least one of a push or pull with respect to ground power unit 138.

In one illustrative example, one or more technical solutions are present that overcome a technical problem with managing power 106 in airplane 102. As a result, one or more technical solutions may provide a technical effect of collecting data from airplane systems 104 in a manner that allows for more efficient management of power 106 in airplane 102. One or more technical solutions collect at least one of power quality data 114 or load management data 116 from airplane systems 104 in airplane 102. This data is aggregated by power monitor 112 and stored in power quality and load management database 130. This database can be used in predicting maintenance for airplane 102 or airplanes 134.

As a result, computer system 124 operates as a special purpose computer system in which power monitor 112 in computer system 124 enables collecting at least one of power quality data 114 or load management data 116 in a manner that enables predicting when maintenance is needed. With the variable sampling rate in data collectors 110, sufficient data can be collected to calculated parameters needed for load management operations 128. In particular, power monitor 112 transforms computer system 124 into a special purpose computer system as compared to currently available general computer systems that do not have power monitor 112.

Thus, one or more illustrative examples provides an ability to aggregate power quality data 114 and load management data 116 during different phases of flight. This data can be stored in a local memory. In this manner, load management can be performed using load manager 144. For example, load manager 144 may use this data to ensure that the predefined maximum allowable load is not exceeded during a phase of flight such as takeoff. This data can provide information about how loads change based on phases of flight 126 of airplane 102. The data also may provide information about how loads change based on environmental conditions. While on the ground, the power source is normally the ground power unit (GPU) although there may be instances where auxiliary power unit (APU) is used. While in flight, the power sources are two or more engine drive generators. The electrical load on the ground power unit may not be the same as on the generators when the aircraft is in flight. Although the ground power unit conforms to standards, the anomalies observed on the power lines can be different due to the different load conditions. Therefore, the data analyzed should take into account the context the measured data is captured.

Further, in one illustrative example, power quality data 114 and load management data 116 may be transferred to a database, such as power quality and load management database 130, while airplane 102 is on the ground and connected to ground power unit 138 through power line 140. The connection may enable transferring data through power line 140 using a connection following broadband over powerline communication standards.

Figure 2:
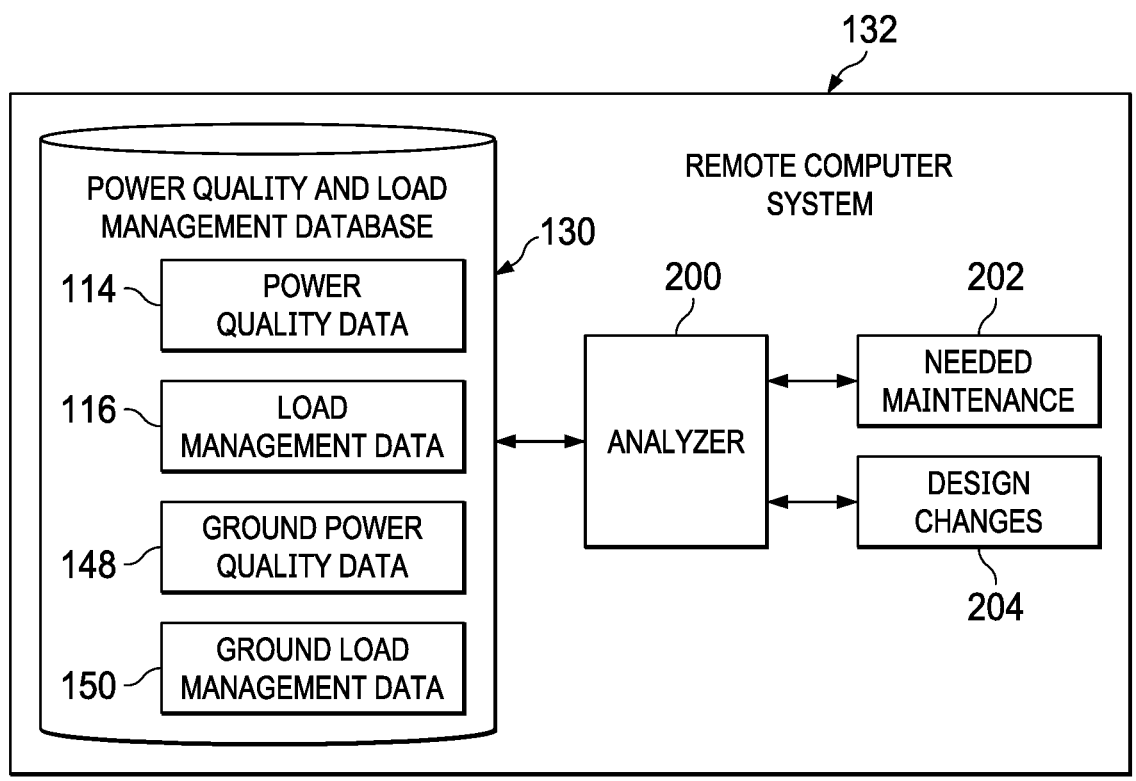
FIG. 2 is an illustration of a block diagram of an analyzer in accordance with an illustrative embodiment.

With reference next to FIG. 2, an illustration of a block diagram of an analyzer is depicted in accordance with an illustrative embodiment. In the illustrative examples, the same reference numeral may be used in more than one figure. This reuse of a reference numeral in different figures represents the same element in the different figures.

In this illustrative example, analyzer 200 is a component in remote computer system 132. As depicted, analyzer 200 is in communication with power quality and load management database 130. Analyzer 200 accesses at least one of power quality data 114 or load management data 116 stored in power quality and load management database 130 to perform an analysis of at least one of power quality data 114 or load management data 116 for airplane 102 and other airplanes in airplanes 134 as shown in block form in FIG. 1.

For example, analyzer 200 can identify needed maintenance 202 using power quality and load management database 130. As depicted, needed maintenance 202 is for the group of airplanes 134 which is any or all of the group of airplanes 134. Needed maintenance 202 can be for airplanes 134 based on those airplanes having the same configuration or of the same model in the group of airplanes 134. Analyzer 200 can be located in at least one of computer system 124 in airplane 102 or remote computer system 132.

The prediction can be performed using models of the airplane system and the airplane. For example, a reliability model can be created for the airplane system or the entire airplane, including the airplane system. The prediction also can be made using statistical analysis or machine learning.

For example, analyzer 200 predicts a degradation in the operation of an airplane system in the group of airplanes 134 using power quality data 114 and load management data 116, both shown in block form in FIG. 1, for the group of airplanes 134 in power quality and load management database 130. As depicted, this prediction can identify needed maintenance 202 for the airplane system prior to degradation reaching an undesired level. The undesired level can be when the airplane system operates out of specification, increases a use of fuel beyond a desired level, causes noise greater than a specified level, no longer operates, or has some other type of undesired degradation in performance.

As another illustrative example, analyzer 200 can analyze power quality data 114 and load management data 116 in power quality and load management database 130 to identify design changes 204 for one or more models within airplanes 134. For example, the analysis can be performed to evaluate margins in power usage in airplanes 134. In other words, analyzer 200 can identify how close power usage by loads, such as airplane systems in airplane 102, are to the specifications for the loads. With this information, design changes 204 may be made to airplane systems 104, power generators, and other devices to reduce the margins in power usage.

Further, analyzer 200 can analyze at least one of ground power quality data 148 or ground load management data 150. This analysis can be performed by analyzer 200 to identify variations in ideal power quality from ground power units that cause unscheduled maintenance for a group of airplanes 134. For example, this analysis may include identifying changes such as frequency drifts that correlate to failures in line replaceable units or ground power unit failures. This analysis may be used to protect future undesired operation of these and other systems.

This analysis also includes analyzing at least one of power quality data 114 or load management data 116 in addition to analyzing at least one of ground power quality data 148 or ground load management data 150. In this manner, analyzer 200 is capable of identifying variations in ideal power quality from at least one of ground power units for power generators 122 in airplane 102, both shown in block form in FIG. 1, that cause unscheduled maintenance for the group of airplanes 134.

Thus, analyzer 200 can perform an analysis of at least one of power quality data 114 or load management data 116 in power quality and load management database 130 to verify and isolate anomalies in power usage during the operation of airplane 102 or other ones of airplanes 134. Further, analyzer 200 also can analyze at least one of ground power quality data 148 or ground load management data 150 to determine whether ground power unit 138 contributes to an undesired quality level for power 106, both shown in block form in FIG. 1, within airplane 102.

The illustration of power management environment 100 and the different components in FIG. 1 and in FIG. 2 are not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

For example, in another illustrative example, analyzer 200 can be part of airplane power monitoring system 108 in airplane 102 rather than being in a remote location such as remote computer system 132. Still another illustrative example, load manager 144 may be located remotely from airplane 102. Load manager 144 can manage loads for multiple ones of airplanes 134. Further, although not shown, connectors such as power buses connect airplane systems 104 to power generators 122.

Figure 3:
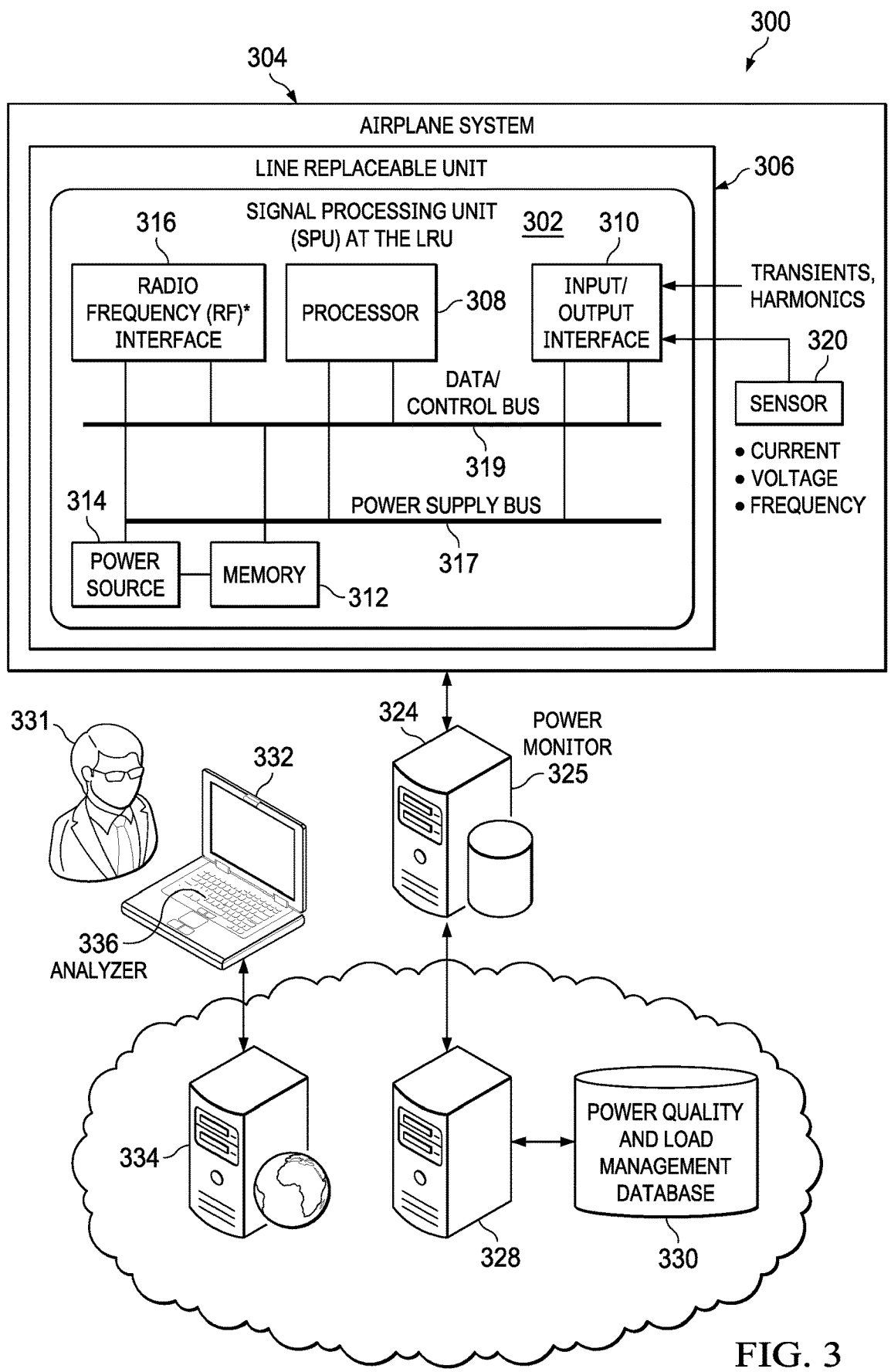
FIG. 3 is an illustration of a data flow diagram showing data flow between components in a power management environment in accordance with an illustrative embodiment.

With reference next to FIG. 3, an illustration of a data flow diagram showing data flow between components in a power management environment is depicted in accordance with an illustrative embodiment. In this example, power management environment 300 is an example of one implementation of power management environment 100 shown in block form in FIG. 1.

As depicted, signal processing unit (SPU) 302 is located in airplane system 304. As depicted, airplane system 304 takes the form of line replaceable unit 306, which may be a bus power control unit (BPCU), a generator control unit (GCU), a ground power unit (GPU), an in-flight entertainment system, or some other suitable type of line replaceable unit.

Signal processing unit 302 is an example of an implementation for a data collector in data collectors 110 shown in block form in FIG. 1. As depicted, signal processing unit 302 can be located in a card located inside of line replaceable unit 306. As depicted, signal processing unit 302 includes processor 308, input/output interface 310, memory 312, power source 314, and radio frequency (RF) interface 316. These components communicate with each other through data control bus 319. Power can be supplied to these units through power supply bus 317.

In this illustrative example, input/output interface 310 provides a connection to sensor 320. Sensor 320 can be configured to detect at least one of a current, a voltage, or a frequency is power quality data for line replaceable unit 306. Current parameters are examples of load management data. The current parameters may be, for example, single-phase alternating current (AC) currents, three-phase alternating current (AC) currents, or direct current (DC) currents. This data can be obtained from sensors. Other load management data that is used along with current may include, for example, the source configuration on the airplane at the time the current is recorded. The source configuration can be determined by monitoring source currents.

This information is stored in memory 312. Additionally, the information may be preprocessed by processor 308. Power source 314 supplies power to the other components in signal processing unit 302 via power supply bus 317.

As depicted, signal processing unit 302 pushes data to onboard server 324. Onboard server 324 is an example of a physical computer in computer system 124 shown in block form in FIG. 1. In this illustrative example, power monitor 325 runs on onboard server 324. The pushing of data may be performed based on a set of rules established for an event that causes the data to be sent from memory 312 to power monitor 325 on onboard server 324. In other illustrative examples, power monitor 325 can pull the data by sending a request to signal processing unit 302.

In this illustrative example, other signal processing units that function as data collectors also may be present that communicate with power monitor 325 in onboard server 324. As depicted, onboard server 324 can establish a connection to ground-based database server 328. This connection may be established through a power line connecting the airplane, in which onboard server 324 is located, with a ground power at an airport. In other illustrative examples, the connection may be a wireless connection established using a wireless signal.

Ground-based database server 328 can receive the data from power monitor 325 and store this data in power quality and load management database 330. Ground-based database server 328 is a physical example of a computer in remote computer system 132 shown in block form in FIG. 1. This database is an example of one implementation for power quality and load management database 130 shown in block form in FIG. 1.

As depicted, the data stored in power quality and load management database 330 can be accessed by user 331 operating laptop computer 332. Laptop computer 332 is an example of a computer in remote computer system 132 shown in block form in FIG. 1. Laptop computer 332 establishes a connection with Web server 334. Web server 334 is another example of a computer in remote computer system 132.

As depicted, analyzer 336 runs on laptop computer 332. Analyzer 336 is configured to analyze the data in power quality and load management database 330.

The illustration of power management environment 300 in FIG. 3 is provided for purposes of illustrating one manner in which components in power management environment 100 shown in block form in FIG. 1 may be implemented along with data flow between the components. This illustration is not meant to limit the manner in which other illustrative embodiments may be implemented.

For example, analyzer 336 can run on other types of computers other than laptop computer 332. For example, analyzer 336 may run on a tablet computer, a mobile phone, a desktop computer, a workstation, or some other suitable type of data processing system.

Figure 4:
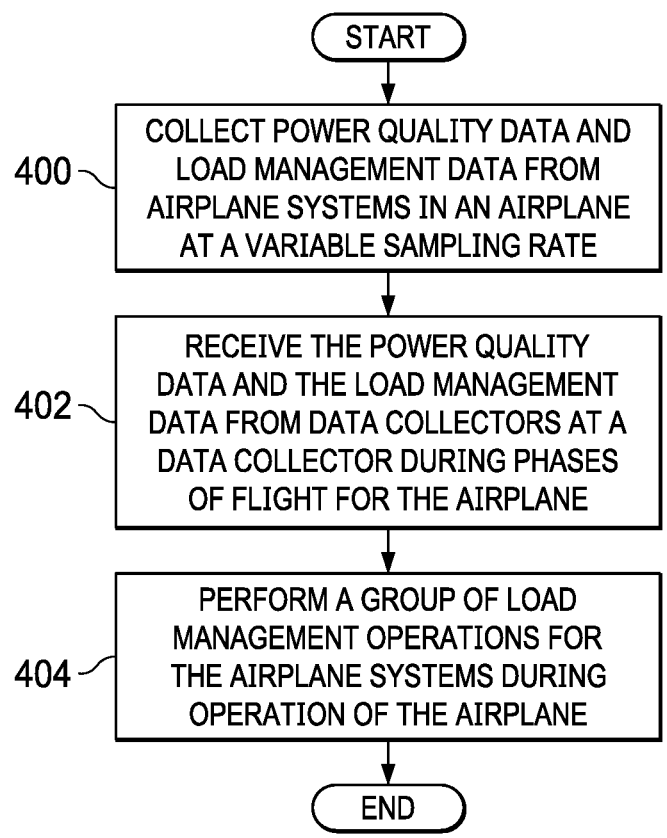
FIG. 4 is an illustration of a flowchart of a process for managing power in an airplane in accordance with an illustrative embodiment.

Turning next to FIG. 4, an illustration of a flowchart of a process for managing power in an airplane is depicted in accordance with an illustrative embodiment. The process illustrated in FIG. 4 can be implemented in at least one of hardware or software. When implemented using software, program code can be run on a processor unit to perform the different operations in this process. This process may be implemented in airplane power monitoring system 108 shown in block form in FIG. 1. For example, the different operations may be implemented in data collectors 110, power monitor 112, and load manager 144, all shown in block form in FIG. 1.

The process begins by collecting power quality data and load management data from airplane systems in an airplane at a variable sampling rate (operation 400). In this example, operation 400 is performed using data collectors assigned to the airplane systems in which the variable sampling rate increases in response to a selected trigger event.

The process receives the power quality data and the load management data from data collectors at a data collector during phases of flight for the airplane (operation 402). In this example, operation 402 aggregates power quality data and load management data from the different airplane systems in the airplane. Further, as part of receiving power quality data and load management data, processing of the data may be performed in operation 402. This processing can include signal processing of voltages, currents, frequencies, or other parameters for electrical signals. This processing may include identifying harmonics, modulation, power factors, or other suitable types of parameters if this processing is not by the data collectors.

The process performs a group of load management operations for the airplane systems during operation of the airplane (operation 404). The process terminates thereafter. Operation 404 can be performed by a load manager in the airplane. The group of operations is performed using the power quality data and the load management data received from the data collectors during phases of flight for the airplane.

Figure 5:
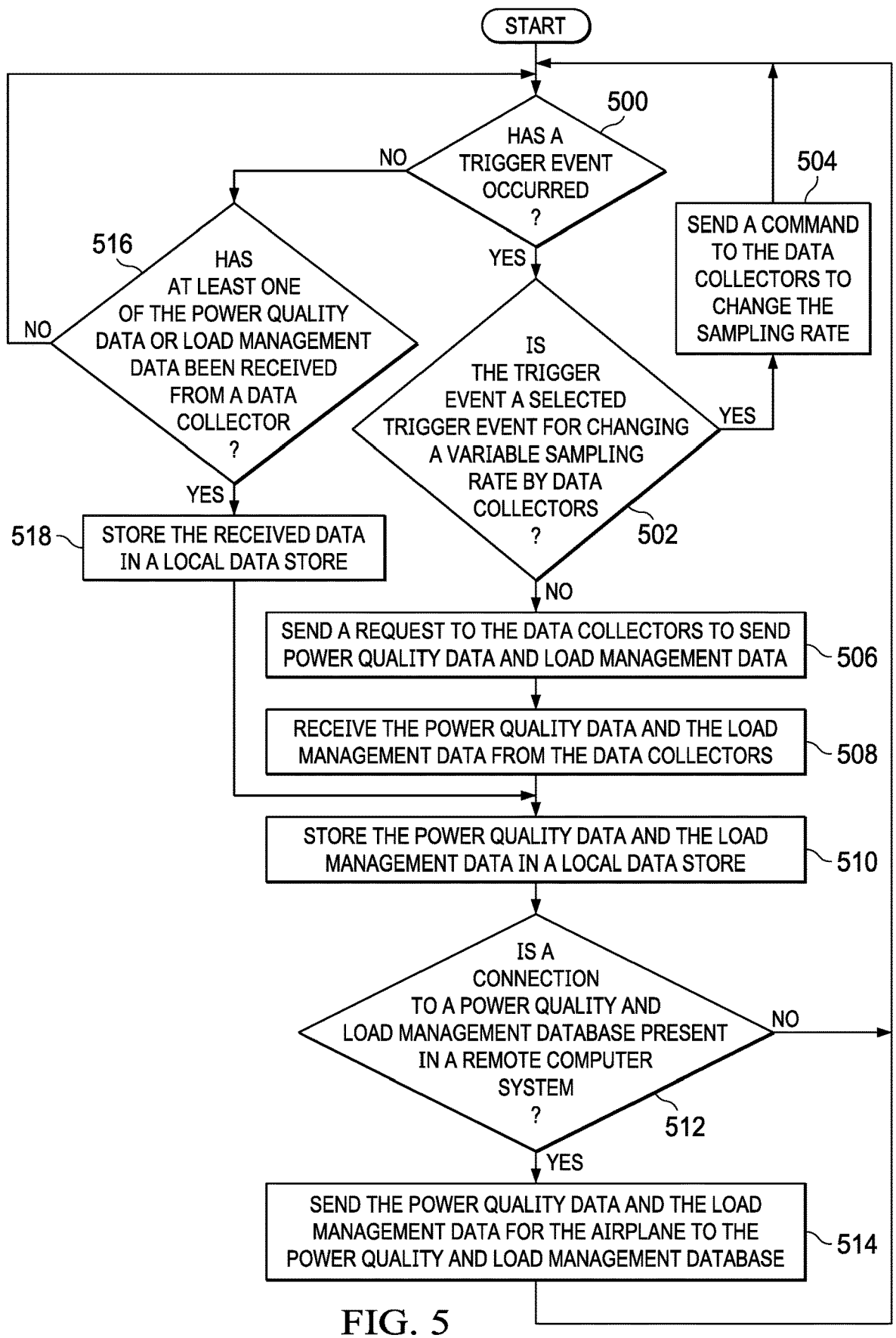
FIG. 5 is an illustration of a flowchart of a process for collecting data for analyzing power use in accordance with an illustrative embodiment.

With reference now to FIG. 5, an illustration of a flowchart of a process for collecting data for analyzing power use is depicted in accordance with an illustrative embodiment. The process illustrated in FIG. 5 can be implemented in at least one of hardware or software. When implemented using software, program code can be run on a processor unit to perform the different operations in this process. This process may be implemented in airplane power monitoring system 108 shown in block form in FIG. 1. For example, the different operations may be implemented in power monitor 112 shown in block form in FIG. 1.

The process begins by determining whether a trigger event has occurred (operation 500). The trigger event may take various forms. For example, the trigger event may be periodic events such as the expiration of the timer. In another illustrative example, this trigger event may be a change in a phase of flight, the beginning of a phase of flight, retracting landing gear, a control surface moving to a selected position, or some other suitable event.

If a trigger event has been detected, a determination is made as to whether the trigger event is a selected trigger event for changing a variable sampling rate by the data collectors (operation 502). If the trigger event is a selected trigger event, the power monitor sends a command to the data collectors to change the sampling rate (operation 504). The process then returns to operation 500.

With reference again to operation 502, if the trigger event is not a selected trigger event, the power monitor sends a request to the data collectors to send power quality data and load management data (operation 506). The process receives the power quality data and the load management data from the data collectors (operation 508). The process stores the power quality data and the load management data in a local data store (operation 510).

A determination is made as to whether a connection to a power quality and load management database is present in a remote computer system (operation 512). If a connection is present, the process sends the power quality data and the load management data for the airplane to the power quality and load management database (operation 514).

The power quality data and the load management data are stored for a group of airplanes in the power quality and load management database. In other words, the power quality and load management data can be stored for many airplanes. This data can be used to identify and schedule maintenance for one or more airplanes. This data also may be used to identify design changes for one or more systems of one or more models of airplanes.

The process then returns to operation to operation 500. In operation 512, if a connection is absent, the process also returns to operation 500.

With reference again to operation 500, if a trigger event has not occurred, the process determines whether at least one of the power quality data or the load management data has been received from a data collector (operation 516). In operation 516, the data could be received in response to the request for the power quality data and the load management data made in operation 506. Additionally, the data received in operation 516 could be data pushed by one or more data collectors.

If at least one of power quality data or load management data has been received from a data collector, the process stores the received data in the local data store (operation 518). The process then returns to operation 510 as described above. With reference again to operation 516, if at least one of power quality data or load management data has not been received from the data collected, the process returns to operation 500.

Figure 6:
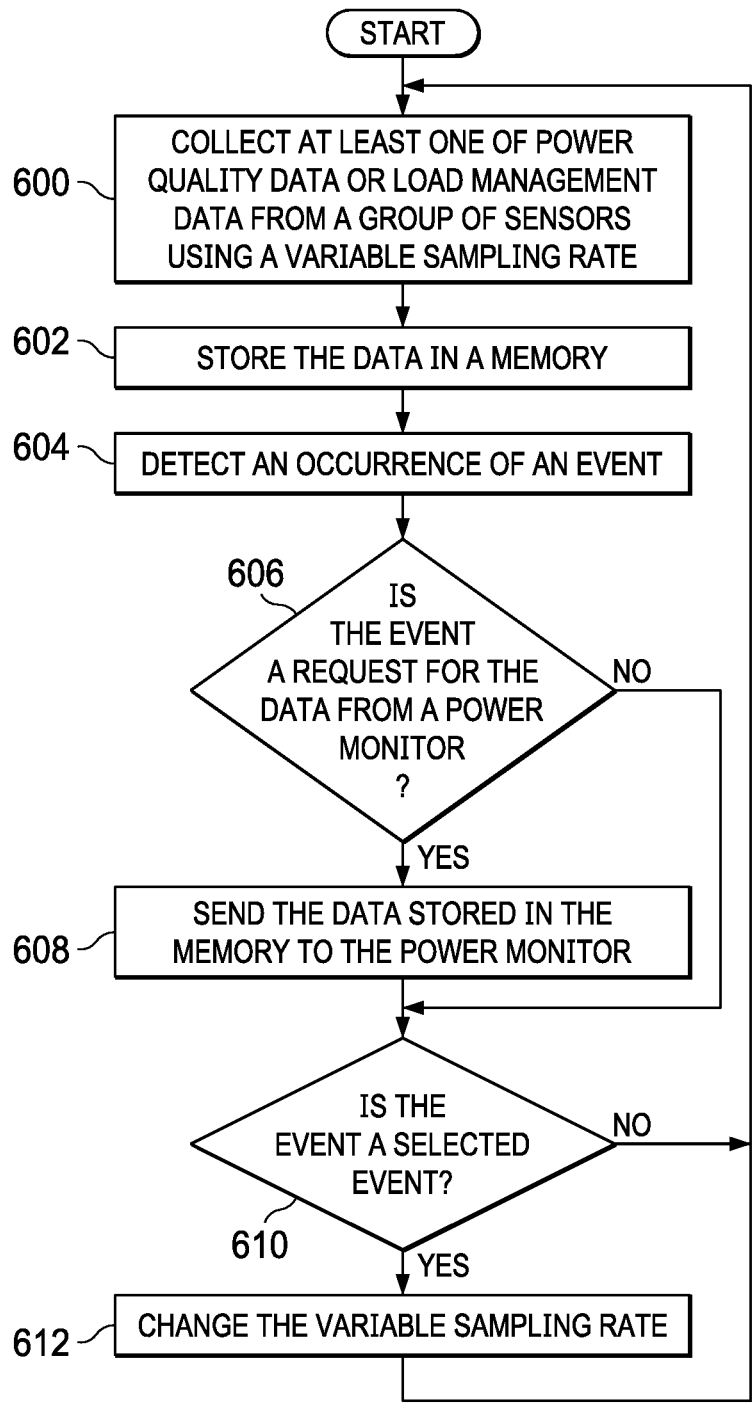
FIG. 6 is an illustration of a flowchart of a process for collecting data from airplane systems in accordance with an illustrative embodiment.

With reference to FIG. 6, an illustration of a flowchart of a process for collecting data from airplane systems is depicted in accordance with an illustrative embodiment. The process illustrated in FIG. 6 can be implemented in at least one of hardware or software. When implemented using software, program code can be run on a processor unit to perform the different operations in this process. This process may be implemented in airplane power monitoring system 108 shown in block form in FIG. 1. For example, the different operations may be implemented in a data collector in data collectors 110 shown in block form in FIG. 1.

The process begins with a data collector collecting at least one of power quality data or load management data from a group of sensors using a variable sampling rate (operation 600). In this illustrative example, the group of sensors is one or more sensors. The variable sampling rate is a default or starting sampling rate this example when the data collector starts collecting data.

The data collector stores the data in a memory (operation 602). The data collector also preprocesses the power quality data load management data. For example, the data collector can perform signal processing of voltages, currents, frequencies, or other parameters for electrical signals. This preprocessing may include identifying harmonics, modulation, power factors, or other suitable types of parameters.

The data collector detects the occurrence of an event (operation 604). The data collector determines whether the event is a request for data from a power monitor (operation 606). If the event is a request for data, the data collector sends the data stored in the memory to the power monitor (operation 608).

The data collector then determines whether the event is a selected event (operation 610). The selected event may take various forms. For example, the selected event may be a phase applied for the airplane, a command from the power monitor to change the sampling rate, a request for data from the power monitor, or other suitable events.

If the event is a selected event, the process changes the variable sampling rate (operation 612). The process then returns to operation 600. In this example, the selected event could change the variable sampling rate back to the default or starting sampling rate.

In this example, the variable sampling rate is increased. The increase may be, for example, to provide sufficient data to identify other parameters preprocessing such as harmonics. The change in the sampling rate may be a predetermined change stored by the data collector. In other illustrative examples, the change in the sampling rate may be sent in a command or other message from the power monitor.

With reference again to operation 606, if the event is not a request for data, the process proceeds to operation 610. In operation 610, if the event is not a selected event, the process returns to operation 600.

The flowcharts and block diagrams in the different depicted embodiments illustrate the architecture, functionality, and operation of some possible implementations of apparatuses and methods in an illustrative embodiment. In this regard, each block in the flowcharts or block diagrams can represent at least one of a module, a segment, a function, or a portion of an operation or step. For example, one or more of the blocks can be implemented as program code, hardware, or a combination of the program code and hardware. When implemented in hardware, the hardware may, for example, take the form of integrated circuits that are manufactured or configured to perform one or more operations in the flowcharts or block diagrams. When implemented as a combination of program code and hardware, the implementation may take the form of firmware. Each block in the flowcharts or the block diagrams may be implemented using special purpose hardware systems that perform the different operations or combinations of special purpose hardware and program code run by the special purpose hardware.

In some alternative implementations of an illustrative embodiment, the function or functions noted in the blocks may occur out of the order noted in the figures. For example, in some cases, two blocks shown in succession may be performed substantially concurrently, or the blocks may sometimes be performed in the reverse order, depending upon the functionality involved. Also, other blocks may be added in addition to the illustrated blocks in a flowchart or block diagram.

Figure 7:
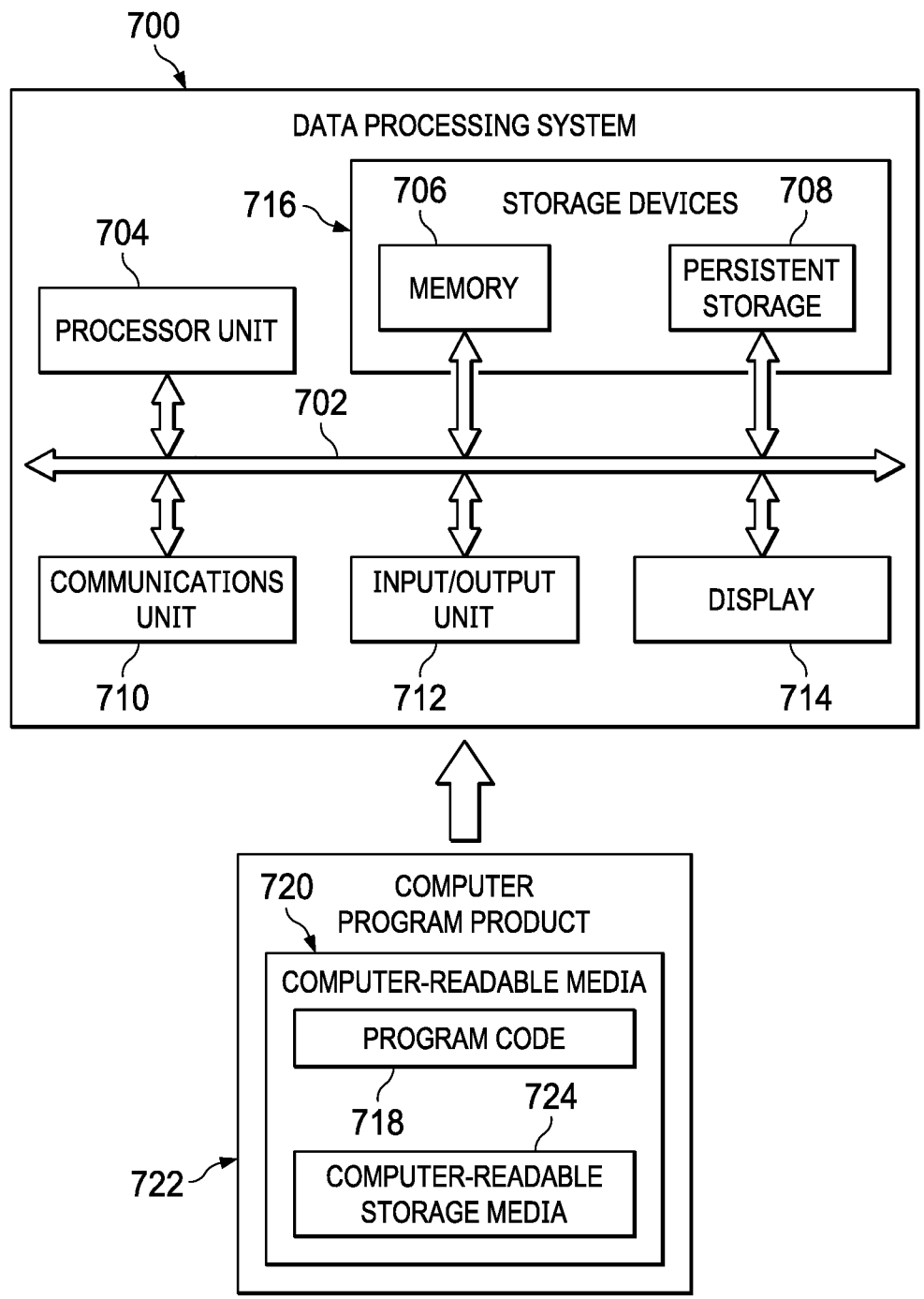
FIG. 7 is an illustration of a block diagram of a data processing system in accordance with an illustrative embodiment.

Turning now to FIG. 7, an illustration of a block diagram of a data processing system is depicted in accordance with an illustrative embodiment. Data processing system 700 may be used to implement computer system 124 in FIG. 1. In this illustrative example, data processing system 700 includes communications framework 702, which provides communications between processor unit 704, memory 706, persistent storage 708, communications unit 710, input/output (I/O) unit 712, and display 714. In this example, communications framework 702 may take the form of a bus system.

Processor unit 704 serves to execute instructions for software that may be loaded into memory 706. Processor unit 704 may be a number of processors, a multi-processor core, or some other type of processor, depending on the particular implementation.

Memory 706 and persistent storage 708 are examples of storage devices 716. A storage device is any piece of hardware that is capable of storing information, such as, for example, without limitation, at least one of data, program code in functional form, or other suitable information either on a temporary basis, a permanent basis, or both on a temporary basis and a permanent basis. Storage devices 716 may also be referred to as computer-readable storage devices in these illustrative examples. Memory 706, in these examples, may be, for example, a random-access memory or any other suitable volatile or non-volatile storage device. Persistent storage 708 may take various forms, depending on the particular implementation.

For example, persistent storage 708 may contain one or more components or devices. For example, persistent storage 708 may be a hard drive, a solid state hard drive, a flash memory, a rewritable optical disk, a rewritable magnetic tape, or some combination of the above. The media used by persistent storage 708 also may be removable. For example, a removable hard drive may be used for persistent storage 708.

Communications unit 710, in these illustrative examples, provides for communications with other data processing systems or devices. In these illustrative examples, communications unit 710 is a network interface card.

Input/output unit 712 allows for input and output of data with other devices that may be connected to data processing system 700. For example, input/output unit 712 may provide a connection for user input through at least one of a keyboard, a mouse, or some other suitable input device. Further, input/output unit 712 may send output to a printer. Display 714 provides a mechanism to display information to a user.

Instructions for at least one of the operating system, applications, or programs may be located in storage devices 716, which are in communication with processor unit 704 through communications framework 702. The processes of the different embodiments may be performed by processor unit 704 using computer-implemented instructions, which may be located in a memory, such as memory 706.

These instructions are referred to as program code, computer usable program code, or computer-readable program code that may be read and executed by a processor in processor unit 704. The program code in the different embodiments may be embodied on different physical or computer-readable storage media, such as memory 706 or persistent storage 708.

Program code 718 is located in a functional form on computer-readable media 720 that is selectively removable and may be loaded onto or transferred to data processing system 700 for execution by processor unit 704. Program code 718 and computer-readable media 720 form computer program product 722 in these illustrative examples. In the example, computer-readable media 720 is computer-readable storage media 724. In these illustrative examples, computer-readable storage media 724 is a physical or tangible storage device used to store program code 718 rather than a medium that propagates or transmits program code 718.

Alternatively, program code 718 may be transferred to data processing system 700 using a computer-readable signal media. The computer-readable signal media may be, for example, a propagated data signal containing program code 718. For example, the computer-readable signal media may be at least one of an electromagnetic signal, an optical signal, or any other suitable type of signal. These signals may be transmitted over at least one of communications links, such as wireless communications links, optical fiber cable, coaxial cable, a wire, or any other suitable type of communications link.

The different components illustrated for data processing system 700 are not meant to provide architectural limitations to the manner in which different embodiments may be implemented. The different illustrative embodiments may be implemented in a data processing system including components in addition to or in place of those illustrated for data processing system 700. Other components shown in FIG. 7 can be varied from the illustrative examples shown. The different embodiments may be implemented using any hardware device or system capable of running program code 718.

Figure 8:
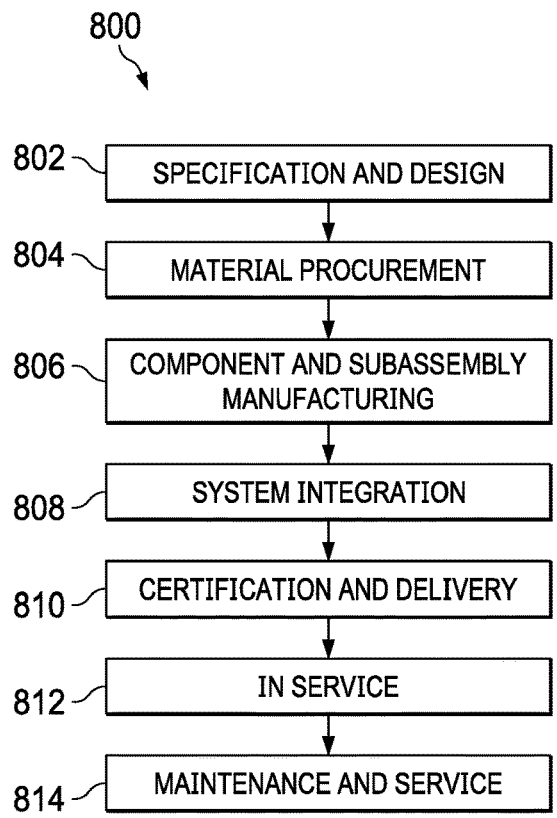
FIG. 8 is an illustration of a block diagram of an airplane manufacturing and service method in accordance with an illustrative embodiment.
Figure 9:
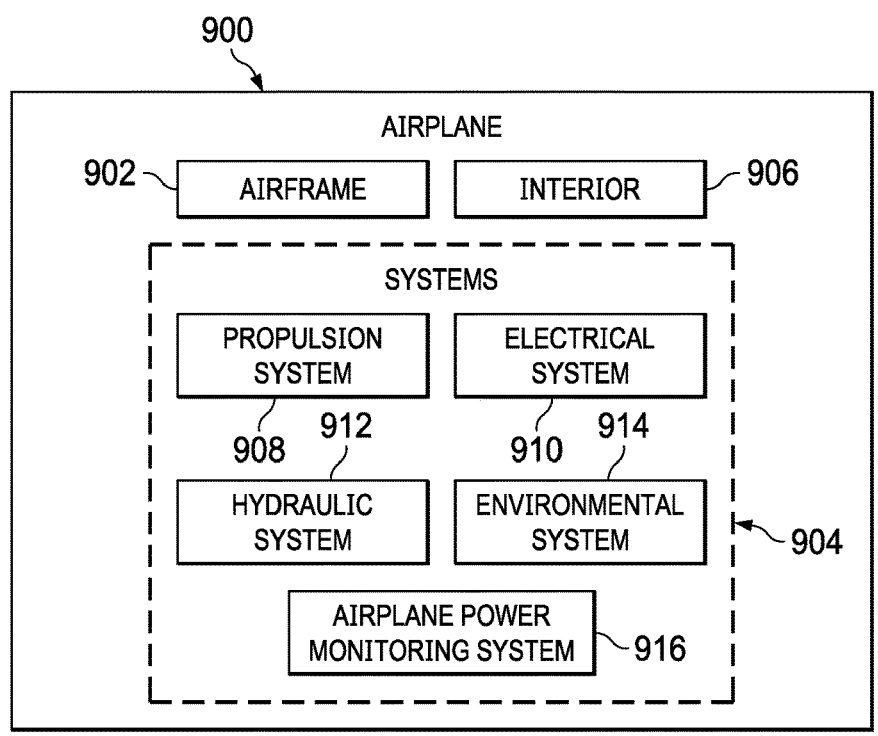
FIG. 9 is an illustration of a block diagram of an airplane in which an illustrative embodiment may be implemented.

Illustrative embodiments of the disclosure may be described in the context of airplane manufacturing and service method 800 as shown in FIG. 8 and airplane 900 as shown in FIG. 9. Turning first to FIG. 8, an illustration of a block diagram of an airplane manufacturing and service method is depicted in accordance with an illustrative embodiment. During pre-production, airplane manufacturing and service method 800 may include specification and design 802 of airplane 900 in FIG. 9 and material procurement 804.

During production, component and subassembly manufacturing 806 and system integration 808 of airplane 900 takes place. Thereafter, airplane 900 may go through certification and delivery 810 in order to be placed in service 812. While in service 812 by a customer, airplane 900 is scheduled for routine maintenance and service 814, which may include modification, reconfiguration, refurbishment, and other maintenance or service.

Each of the processes of airplane manufacturing and service method 800 may be performed or carried out by a system integrator, a third party, an operator, or some combination thereof. In these examples, the operator may be a customer. For the purposes of this description, a system integrator may include, without limitation, any number of airplane manufacturers and major-system subcontractors; a third party may include, without limitation, any number of vendors, subcontractors, and suppliers; and an operator may be an airline, a leasing company, a military entity, a service organization, and so on.

With reference now to FIG. 9, an illustration of a block diagram of an airplane is depicted in which an illustrative embodiment may be implemented. In this example, airplane 900 is produced by airplane manufacturing and service method 800 in FIG. 8 and may include airframe 902 with plurality of systems 904 and interior 906. Airplane 900 may be a commercial airplane such as a jetliner. Examples of systems 904 include one or more of propulsion system 908, electrical system 910, hydraulic system 912, environmental system 914, and airplane power monitoring system 916. Any number of other systems may be included. Although an aerospace example is shown, different illustrative embodiments may be applied to other industries, such as the automotive industry.

Apparatuses and methods embodied herein may be employed during at least one of the stages of airplane manufacturing and service method 800 in FIG. 8. For example, data collectors in a power monitor, such as data collectors 110 in power monitor 112 as shown in block form in FIG. 1 may be implemented in airplane power monitoring system 916 in airplane 900 in FIG. 9. These components may be implemented in airplane 900 during system integration 808. These components in airplane power monitoring system 916 operate while airplane 900 is in service 812. The data collected may be analyzed to predict and scheduled maintenance and service 814. Further, the data also may be analyzed for use in making design changes in specification and design 802.

In one illustrative example, components or subassemblies produced in component and subassembly manufacturing 806 in FIG. 8 may be fabricated or manufactured in a manner similar to components or subassemblies produced while airplane 900 is in service 812 in FIG. 8. As yet another example, one or more apparatus embodiments, method embodiments, or a combination thereof may be utilized during production stages, such as component and subassembly manufacturing 806 and system integration 808 in FIG. 8. One or more apparatus embodiments, method embodiments, or a combination thereof may be utilized while airplane 900 is in service 812, during maintenance and service 814 in FIG. 8, or both. The use of a number of the different illustrative embodiments may substantially expedite the assembly of airplane 900, reduce the cost of airplane 900, or both expedite the assembly of airplane 900 and reduce the cost of airplane 900.

Thus, one or more illustrative examples provide a method, apparatus, and system for managing power in an airplane. Data collectors associated with different airplane systems are configured to the collective least one of power quality data or load management data from different airplane systems. The data collectors send the data to the power monitor, which aggregates the data. In this manner, a more complete picture of power use and lows in airplane 102 can be obtained. This aggregation of data may be used by a load manager in the airplane to manage loads such as the airplane systems. Further, the data may also be used to manage power generators in the airplane.

The power quality data management data can be sent to a database such as a power quality and load management database. This database may be used to aggregate data from many airplanes. With this database, analysis of power quality data and load management data can be made to identify anomalies in the power use in the airplanes. The analysis also can be performed to predict when an airplane system will perform at a desired level. With this prediction, maintenance can be scheduled for airplane system to avoid an undesired operation of the airplane system. Further, the analysis can be used to make design changes to airplanes.

The description of the different illustrative embodiments has been presented for purposes of illustration and description and is not intended to be exhaustive or limited to the embodiments in the form disclosed. The different illustrative examples describe components that perform actions or operations. In an illustrative embodiment, a component may be configured to perform the action or operation described. For example, the component may have a configuration or design for a structure that provides the component an ability to perform the action or operation that is described in the illustrative examples as being performed by the component.

Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An airplane electrical power monitoring system that comprises:
    a computer system in an airplane;
    data collectors, assigned to line replaceable units for systems that use electrical power in the airplane, and configured to collect power quality data and load management data from the line replaceable units at a variable sampling rate that increases in response to a selected trigger event, such that the selected trigger event comprises a selection from a group that comprises: a phase of flight, a maneuver, an abnormal condition in a line replaceable unit of the line replaceable units, a current demand exceeding a threshold for the current demand, an airplane event, a voltage magnitude exceeding a threshold for the voltage magnitude, a ripple voltage magnitude exceeding a threshold for the ripple voltage magnitude, a total harmonic distortion exceeding a threshold for the total harmonic distortion, a power interrupt, a power transfer, a selected pilot action, or an action affecting a power quality or a load management on the airplane; and
    a power monitor in the computer system, configured to receive the power quality data and the load management data from the data collectors during phases of flight for the airplane.

2. The airplane electrical power monitoring system of claim 1 further comprising:
    a power quality and load management database configured to store the power quality data and the load management data for a group of airplanes, wherein the power monitor sends the power quality data and the load management data for the airplane to the power quality and load management database; and
    an analyzer configured to identify needed maintenance using the power quality and load management database.

3. The airplane electrical power monitoring system of claim 2, wherein the analyzer is located in at least one of the computer system in the airplane or a remote computer system in a ground location.

4. The airplane electrical power monitoring system of claim 2, wherein in identifying the needed maintenance using the power quality and load management database, the analyzer predicts a degradation in an operation of an airplane system in the group of airplanes using the power quality data and the load management data for the group of airplanes in the power quality and load management database; and identifies the needed maintenance for the airplane system prior to decay reaching an undesired level.

5. The airplane electrical power monitoring system of claim 1 further comprising:
    a ground power unit connected to the airplane by a power line, wherein the power monitor sends the power quality data and the load management data to a database remote to the airplane over the power line using broadband over power line communications.

6. The airplane electrical power monitoring system of claim 5, wherein the power monitor receives at least one of ground power quality data or ground load management data for a ground power unit.

7. The airplane electrical power monitoring system of claim 6 further comprising:
    an analyzer configured to identify variations in ideal power quality from at least one of: a ground power units or an electrical power generator in the airplane that cause unscheduled maintenance for a group of airplanes.

8. The airplane electrical power monitoring system of claim 1, wherein at least one of the data collectors or the power monitor changes the variable sampling rate.

9. The airplane electrical power monitoring system of claim 1, wherein the variable sampling rate returns to a default sampling rate after at least one of a period of time or another trigger event.

10. The airplane electrical power monitoring system of claim 1, wherein the data collectors are selected from at least one of a software application or a hardware unit.

11. The airplane electrical power monitoring system of claim 1, wherein the power quality data includes at least one of: a power, a reactive power, a power factor, a voltage harmonics, the total harmonic distortion, an amplitude voltage modulation, a frequency voltage modulation, a voltage ripple amplitude, a current ripple amplitude, a current ripple frequency, or a voltage ripple frequency.

12. The airplane electrical power monitoring system of claim 1, wherein the load management data includes at least one of: a ripple current amplitude, a ripple current frequency, or a load power factor.

13. A method for managing electrical power in an airplane, the method comprising:
    collecting power quality data and load management data from line replaceable units in systems in the airplane at a variable sampling rate using data collectors assigned to the line replaceable units;
    increasing, responsive to a selected trigger event, the variable sampling rate, the selected trigger event comprising a selection from a group comprising: a phase of flight, a maneuver, an abnormal condition in a line replaceable unit in the line replaceable units, a current demand exceeding a threshold for the current demand, an airplane event, a voltage magnitude exceeding a threshold for the voltage magnitude, a ripple voltage magnitude exceeding a threshold for the ripple voltage magnitude, a total harmonic distortion exceeding a threshold for the total harmonic distortion, a power interrupt, a power transfer, a selected pilot action, or an action affecting a power quality or a load management on the airplane;
    receiving, by a power monitor, the power quality data and the load management data from the data collectors during phases of flight for the airplane; and
    performing, by a load manager in the airplane, a group of load management operations for the systems during operation of the airplane, wherein the group of load management operations is performed using the power quality data and the load management data received from the data collectors during the phases of flight for the airplane.

14. The method of claim 13 further comprising:
    sending the power quality data and the load management data for the airplane to a power quality and load management database;
    storing the power quality data and the load management data for a group of airplanes in the power quality and load management database; and
    identifying needed maintenance using the power quality and load management database.

15. The method of claim 14, wherein an identifying step is performed by an analyzer located in at least one of a computer system in the airplane or a remote computer system in a ground location.

16. The method of claim 14, wherein identifying the needed maintenance using the power quality and load management database comprises:
- predicting, by an analyzer, a degradation in the operation of an airplane system in the group of airplanes using the power quality data and the load management data for the group of airplanes;
- identifying the needed maintenance for the airplane system prior to the degradation reaching an undesired level; and
- scheduling the needed maintenance for the airplane.

17. The method of claim 13 further comprising:
- sending the power quality data and the load management data to a power quality and load management database remote to the airplane using broadband over power line communications.

18. The method of claim 13 further comprising:
- receiving at least one of ground power quality data and ground load management data for a ground power unit connected to the airplane.

19. The method of claim 18 further comprising:
- identifying variations in ideal power quality from ground power units that cause unscheduled maintenance in a group of airplanes.

20. The method of claim 13, wherein at least one of the data collectors or the power monitor in the airplane changes the variable sampling rate.

\* \* \* \* \*